(12) United States Patent
Chen (10) Patent No.: US 9,033,525 B1
(45) Date of Patent: May 19, 2015

(54) OPTIMUM SOLAR CONVERSION CELL CONFIGURATIONS

(71) Applicant: The United States of America as Represented by the Administrator of the National Aeronautics & Space Administration (NASA), Washington, DC (US)

(72) Inventor: Bin Chen, Palo Alto, CA (US)

(73) Assignee: The United States of America as Represented by the Administrator of the National Aeronautics & Space Administration (NASA), Washington, DC (US)

( * ) Notice: Subject to any disclaimer, the term of this patent is extended or adjusted under 35 U.S.C. 154(b) by 166 days.

(21) Appl. No.: 13/896,284

(22) Filed: May 16, 2013

Related U.S. Application Data (60) Provisional application No. 61/798,806, filed on Mar. 15, 2013.

(51) Int. Cl.
| | | |
|---|---|---|
| G02B 17/00 | (2006.01) | |
| G02B 27/12 | (2006.01) | |
| H01L 31/054 | (2014.01) | |

(52) U.S. Cl.
CPC ............ *G02B 17/004* (2013.01); *G02B 27/126* (2013.01); *H01L 31/0543* (2013.01)

(58) Field of Classification Search
CPC ...... G02B 27/10; G02B 27/12; G02B 27/126; H01L 31/042; H01L 31/054; H01L 31/0543; H01G 9/209
See application file for complete search history.

(56) References Cited

U.S. PATENT DOCUMENTS

| | | |
|---|---|---|
| 3,899,672 A | 8/1975 | Levi-Setti |
| 4,134,392 A | 1/1979 | Livermore et al. |
| 4,151,828 A | 5/1979 | Mather et al. |
| 4,249,516 A | 2/1981 | Stark |
| 7,904,871 B2 * | 3/2011 | Raymond et al. ............. 716/132 |

* cited by examiner

*Primary Examiner* — Joseph P Martinez
(74) *Attorney, Agent, or Firm* — John F. Schipper; Robert M. Padilla (57) ABSTRACT

Methods for maximizing a fraction of light energy absorbed in each of three classes of light concentrators (rectangular parallelepipeds, paraboloids and prisms) by choice of incident angle of radiation and of one or more geometrical or physical parameters (absorber thickness, paraboloid dimensions, location of paraboloid focus, prism angles, concentrator material, cladding, prism angles, etc.). Alternatively, the light energy absorbed plus the light energy that escapes through non-total internal reflection within the light concentrator can be minimized.

22 Claims, 7 Drawing Sheets

OPTIMUM SOLAR CONVERSION CELL CONFIGURATIONS

ORIGIN OF THE INVENTION

The invention described herein was made in the performance of work under a NASA contract and is subject to the provisions of Public Law 96-517 (35 U.S.C. §202) in which the contractor elected not to retain title.

FIELD OF THE INVENTION

This invention relates to conversion of solar energy to other useful forms of energy, using optimized solar concentration and conversion cells.

BACKGROUND OF THE INVENTION

Polymeric and inorganic semiconductors offer relatively high quantum efficiencies, as high as 80 percent in the near-infrared and ultraviolet regions, and are much less expensive to fabricate than non-amorphous silicon wafers. An optical fiber and cladding can be designed and fabricated to confine light for transport within ultraviolet and near-IT media, using evanescent waves, and to transmit visible wavelength light for direct lighting. By using polymeric and less expensive and easily processable materials for fabrication, and by designing for optimum solar energy absorption for different solar concentrator configurations, the cost effectiveness of a solar energy conversion system can be increased substantially.

What is needed is one or more solar energy cell conversion configurations that are optimized with respect to choices of one, two or more important parameters, such as light incidence angle, geometric parameters of the conversion material, and choice(s) of conversion materials. Preferably, the materials should have reduced cost, relative to the costs of conventional systems, and the optimal configurations should be straightforward to implement. In addition to molding and casting processes, three dimensional additive manufacturing techniques can be used to implement the desired configurations.

SUMMARY OF THE INVENTION

These needs are met by the invention, which provides several solar conversion cells (SCCs) that are individually optimized to provide maximum energy absorption EA in a selected wavelength region, by appropriate choices of light incidence angle, one or more geometric parameters of the concentrator and/or choice(s) of conversion materials.

In a first embodiment, a broad or narrow light beam with an incidence angle $\theta 1$ is received and internally reflected many times within a rectangular parallelepiped of thickness h of solar conversion material, EA can be optimized with respect to the incidence angle $\theta 1$, the thickness h, a reflection coating of the initial light-receiving surface, and the parallelepiped material refractive index ratio n2/n1. The second reflecting surface of the parallelepiped has substantially constant internal reflection (not necessarily 100 percent) for the incidence angle and wavelength region chosen.

In a second embodiment, a broad light beam is received by a truncated paraboloid surface, propagating parallel to the paraboloid axis, and the light is absorbed by a sphere or cylinder (solar concentrator) of solar conversion material of radius d whose center is coincident with the paraboloid focus. The energy absorption EA is optimized with respect to the location of the focus and the concentrator diameter 2d.

In a third embodiment, a light beam is received at a selected incidence angle $\theta 0$ by one surface of a triangular prism of solar conversion material, and undergoes an unlimited number of internal reflections within the prism. The energy absorption EA can be optimized with respect to initial incidence angle $\theta 0$, prism angles, light reflection coefficient at the initial light-receiving surface, and material chosen for the prism. Each of the surfaces of the prism, other than the initial light-receiving surface, has a percent reflection determined with respect to an internal incidence angle $\theta 1$ and wavelength region chosen. In each of the embodiments, most or all of the energy of the incident light is absorbed, not lost, if the body material is capable of absorbing all energy in the chosen wavelength region.

The solar conversion material for any of the first, second and/or third embodiments may at least one inorganic material, drawn from a group comprising bismuth oxides ($Bi_aO_b$), bismuth iodides ($Bi_cI_d$), lead iodide ($PbI_e$), cadmium sulfide (CdS), cadmium selenide (CdSe), cadmium telluride (CdTe) and lead sulfide (PbS),where a, b, c, d and e are positive numerical values.

The solar conversion material for any of the first, second and/or third embodiments may be at least one polymer, drawn from a group comprising poly[2-methoxy-5-(2'-ethylhexyloxy)-p-phenylenevinylene]] (MEH-PPV), olelamine, polythiophene and derivatives thereof, and poly[4,8-bis-substituted-benzo[1,2-b;4,5-b'dithophene-2,6-diyl-alt-4-substitued-thienol[3,4-b[thipphene-2,6-diyl]] (PBBTTT-CF).

DESCRIPTION OF THE INVENTION

Figure 1:
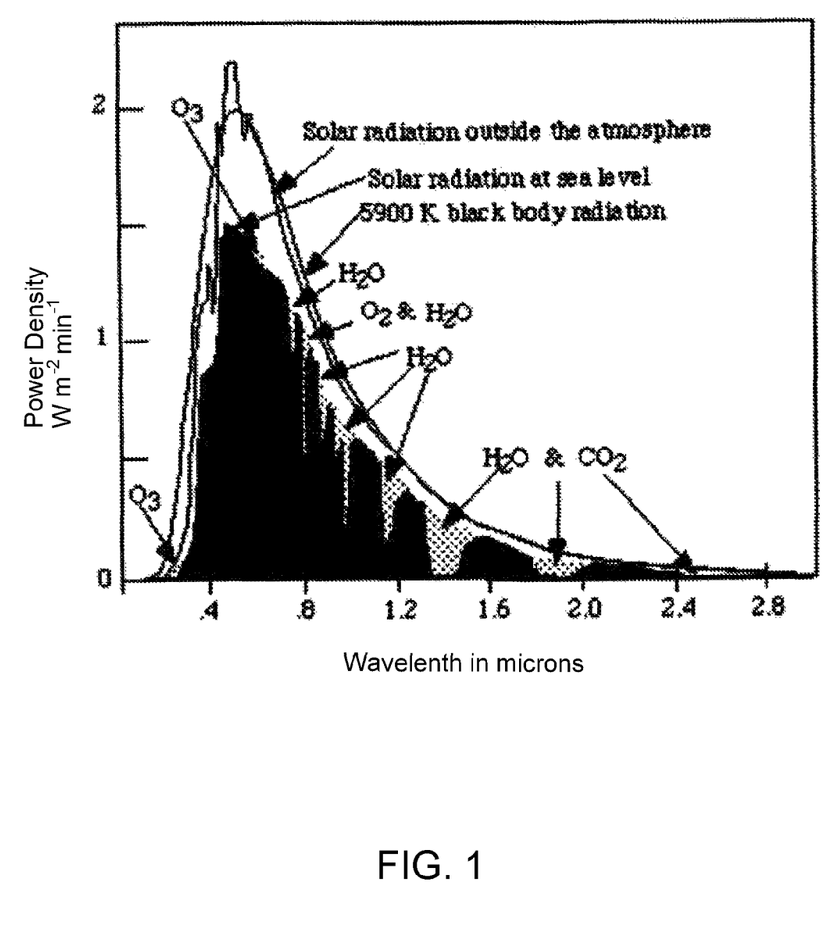
FIG. 1 schematically illustrates effects of passage of solar radiation having different wavelengths through an air mass adjacent to the Earth's surface.

A light beam, emitted from a solar energy source such as the Sun, will pass through the Earth's atmosphere at different angular orientations, depending upon the time of day or night in a diurnal cycle and upon the location on the Earth's surface relative to the source of the incident light beam (e.g., the Sun). At high noon on the Equator (incidence angle $\theta=0°$ at edge of atmosphere) in mid-Summer or mid-Winter, the light beam will pass through one "air mass" (AM=1.0), measured by a line integral of the local air density, integrated along the path of the light beam. As the incidence angle $\theta$ increases toward 90° at the horizon, the number of equivalent air masses AM increases monotonically FIG. 1 schematically illustrates how components of solar energy received at an edge of the atmosphere and at the Earth's surface vary with wavelength. The higher energy (lower wavelength) components will tend to decrease faster than the lower energy fractions as air mass increases above 1.0, except for certain wavelength troughs in the atmosphere.

Rectangular Parallelepiped.

Figure 2:
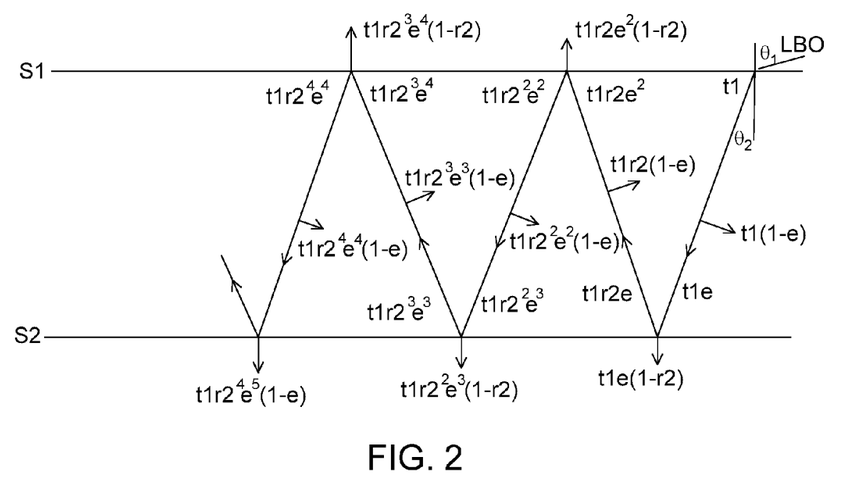
FIGS. 2-5 illustrate optimum energy absorption configurations for three representative types of solar concentrators: a rectangular parallelepiped (FIG. 2); a paraboloid (FIGS. 3 and 4); and a prism (FIG. 5).

FIG. 2 illustrates a first configuration of a solar energy concentrator, a rectangular parallelepiped with a solar conversion cell (SCC) material M2, with associated refractive index n2 for unpolarized light and thickness h (e.g., h=1

μm–1 mm), with a first surface S1 that receives an incident light beam LB0 (with a narrow wavelength band, centered at $\lambda=\lambda 0$), propagating in a first material M1, having a refractive index n1 at an initial incidence angle θ1. The incident light beam is refracted into the SCC at a first surface S1 at a refraction angle θ2. A fraction, t1(θ1) of the incident light beam is transmitted into the SCC with refraction angle θ2, propagates at an incident angle θ2 relative to a second parallel surface S2, is internally reflected at the incidence angle θ2 at the second surface S2, propagates at incidence angle θ2 toward the surface S1, is reflected at the first surface S1 at incidence angle θ2, and repeats the reflection cycle (S1→S2→S1) an unlimited number of times (assuming the length of the SCC is very large or is infinite relative to a light beam cycle length $2h \cdot \sec\theta 2$. The angles θ1 and θ2 for unpolarized light are related by Snell's law, $$n1 \sin\theta 1 = n2 \sin\theta 2, \quad (1)$$

$$\cos\theta 1 = \{1-(n2 \sin\theta 2/n1)^2\}^{1/2}, \quad (2)$$

$$d\theta 1/d\theta 2 = \cos\theta 2/\{(n1/n2)^2 - \sin^2\theta 2\}^{1/2}, \quad (3)$$

with appropriate modifications where polarized incident light is used. Light received from the sun is largely unpolarized, and the incident light received here is assumed to be unpolarized.

The transmission coefficient t1(θ1) at the first surface S1 and the internal reflection coefficient r2(θ2) at the first surface S1 or the second surface S2 may depend upon wavelength $\lambda(\lambda\approx\lambda 0)$ and upon θ1 and θ2, and will behave according to the Fresnel reflection-transmission relations set forth in the following. A portion of the propagating light beam is absorbed with absorption coefficient $\alpha(\lambda)$ per unit length propagated within the SCC material. A fraction $\beta(\lambda)$ (assumed≈1 here) of the absorbed or scattered light beam energy ($0 \leq \beta \leq 1$; β assumed=1 here) may converted by the SCC material into electromagnetic energy with a higher wavelength (e.g., near-infrared, $\lambda=\lambda 1=0.8$–$2.0$ μm). This converted wavelength light ("CWL") may be emitted preferentially in a transverse, longitudinal or other direction, for example at an angle ψ relative to the local direction of the path of the arriving light beam in the SCC material. The SCC has a small thickness h (e.g., 1 μm or a fraction thereof), measured in a direction perpendicular to a plane in which the light beam propagates (plane of the paper in FIG. 2).

The incident light beam enters the SCC at the first surface S1 with a transmission coefficient t1(θ1) (also dependent upon wavelength λ). In a first reflection cycle (S1→S2→S1), this light beam propagates from the first surface S1 to the second parallel surface S2 at the angle θ2, is reflected at S2 with reflection coefficient r2(θ2), returns to S1 at the angle θ2, and is reflected at S1 at the angle θ2 as shown with reflection coefficient r2(θ2). For a first path segment (S1→S2): (1) the fraction of initial energy absorbed by or deposited within the SCC material M2 for a single path segment is $t1(\theta 1) \cdot (1-e)$, where $e = \exp\{-\alpha\, h\, \sec\theta 2\}$); (2) the fraction of energy transmitted (lost) through the surface S2 is $t1(\theta 1)(1-r2(\theta 2)) \cdot e$; and the fraction that is reflected at the surface S2 and propagates toward the surface S1 is $t1(\theta 1) e\, r2(\theta 2)$. For a second segment (S2→S1): (1) the fraction of initial energy absorbed by the SCC material is $t1(\theta 1) \cdot (1-e)(e\, r2)$; (2) the fraction transmitted (lost) through the surface S1 is $t1 r2\, e^2(1-r2)$,; and (3) the fraction that is reflected at the surface S1 and propagates toward the surface S2 is $t1(\theta 1) \cdot (r2\, e)^2$.

FIG. 2 also indicates (i) the fractions of energy absorbed along each path segment, S1→S2 or S2→S1; (ii) the fraction of energy that approaches each surface, S1 or S2; and (iii) the fractions of energy present after the beam is reflected at each surface, S1 or S2. For an infinite number of beam reflections at each of the surfaces, S1 and S2, the fraction of energy deposited within the SCC is $$t1\,EA(\theta 2, h, \lambda)\} = \sum_{m=0}^{\infty} t1(1-e)(r2e)^m = t1(1-e)/\{1-(r2e)\}. \quad (4)$$

Because the incidence angle θ2 is constant for each cycle, the surfaces S1 and S2 can be coated with a thin film interference coating that approximately maximizes the reflection coefficient r2 or the coefficient (r2 e) for a given choice of the incidence angle θ2. This improvement can be incorporated in the SCC and in the reflection value used for r2 or for (r2 e). Determination of an optimal anti-reflection coating for a given incidence angle θ2 is discussed by H. A. MacLeod, *Thin Film Optical Filters*, Institute of Physics Publishing, 2001.

$$t1(\theta 1,\theta 2)=\{(2\, n1 \cos\theta 1)/(n2 \cos\theta 1 + n1 \cos\theta 2)\}^2,$$
=energy transmission coefficient at M1/M2 interface,, (5)

$$r2(\theta 1,\theta 2)=\{(n1 \cos\theta 1 - n2 \cos\theta 2)/(n2 \cos\theta 1 + n1 \cos\theta 2)\}^2,=\{(n1\{1-(n2 \sin\theta 2/n1)^2\}^{1/2} - n2 \cos\theta 2)/(n2\{1-(n2 \sin\theta 2/n1)^2\}^{1/2} - n1 \cos\theta 2)^2\}=\text{internal reflection coefficient at M1/M2 interface} \quad (6)$$

For a fixed SCC material M2, fixed thickness h, and fixed wavelength range, the total fraction F1 is maximized by determining an incidence angle θ2, satisfying Eq. (1), for which $$\partial F1/\partial\theta 2 = 0, \quad (7)$$

$$\partial e/\partial\theta 2 = -\alpha\, h\, \{\sec\theta 2 \tan\theta 2\}\, e,. \quad (8)$$

where e and r2 depend explicitly on θ2 and t1 depends implicitly upon θ2 through the Snell's law relations, (1) and (2) and the Fresnel relations, Eqs. (4) and (6). The quantity $\partial r2/\partial\theta 2$ is computed using Eq. (6) and the Snell's law relations.

For a fixed incidence angle θ2 and fixed wavelength range, the total fraction t1 EA1 is maximized with respect to thickness h by determining an SCC material thickness h for which $$\partial(t1\, EA)1/\partial h = 0; \quad (9A)$$

or equivalently, $$\partial(t1\, EA)/\partial e = 0, \quad (9B)$$

Equation (11B) is satisfied where $$1 - r2 = 0, \quad (9C)$$

which requires that r2=1 (unrealistic). A more realistic optimization is to require that energy absorption per unit volume, proportional to (t1 EA)/h, be maximized. This requirement is equivalent to $$\partial(F1/h)/\partial h = 0, \quad (10)$$

which represents optimization of energy absorbed per unit SCC thickness. The fraction F1 will increase monotonically with increasing attenuation coefficient α, but α is not a parameter that is controllable by the user.

Paraboloid.

Figure 3:
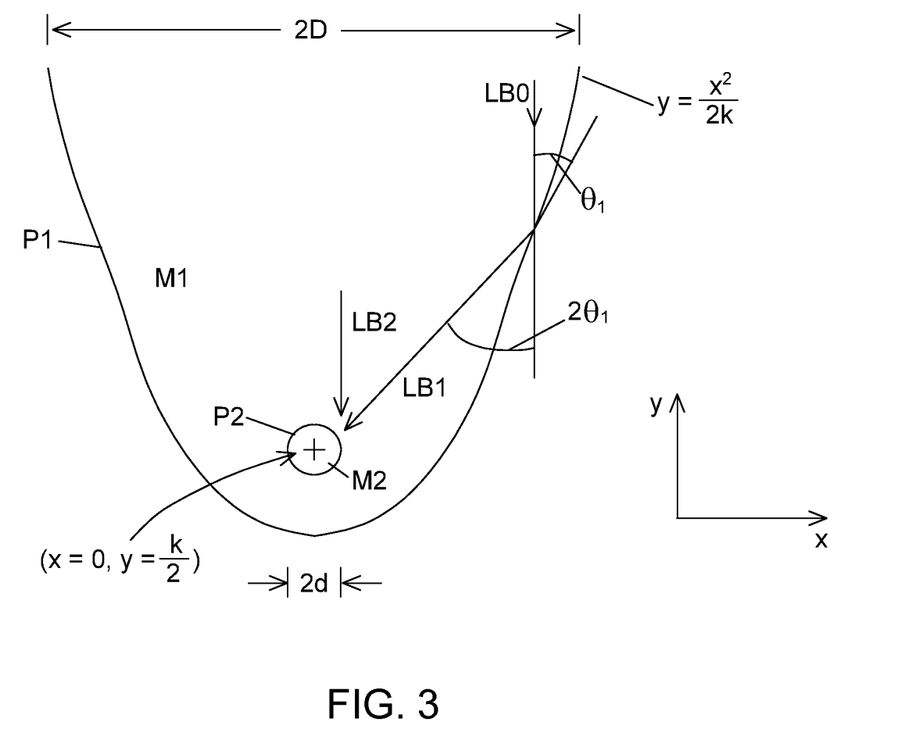

FIG. 3 illustrates a second configuration of a solar cell energy concentrator, a two dimensional or three-dimensional parabola, defined by $y=x^2/2k (-D \leq x \leq D)$, having a thickness Δh1 (e.g., ≈1 μm), with a parabolic-shaped inner surface P1. An initial light beam LB0, moving parallel to a parabola central axis at a distance x from the y-axis ($d \leq x \leq D$), and with a narrow wavelength band, centered at $\lambda \approx \lambda 0$, is received at an initial incidence angle $\theta 1=\theta 1(x)$ relative to a local portion of the inner surface P1 (depending upon x), and is reflected as a first light beam portion LB1 toward the parabola focus F, which has coordinates (x=0, y=k/2). This reflected first light beam LB1 is received by and transmitted at normal incidence into a cylinder-shaped or sphere-shaped SCC of diameter $2d$, having a small thickness $\Delta h2$ (e.g., a fraction of 1 mm) measured in a direction perpendicular to the plane of light beam propagation (plane of the paper in FIG. 3). As in the configuration of FIG. 2, a portion or all of the propagating light beam is absorbed by the SCC material. Within the volume enclosed by the parabolic surface P1 and external to the SCC concentrator, the material is M1 (which may be a partial or full vacuum or air with a selected density), and the SCC is comprised of an energy absorbing material M2 with absorption coefficient $\alpha(\lambda)$ per unit path length in the material M2 (analogous to Eq. (2) for the rectangular parallelepiped material in the first configuration).

The first light beam intersects the parabola inner surface at an angle given by $$\cot\theta 1 = x/k, \qquad (11)$$

relative to the x-axis and is reflected with a reflection coefficient $r1(\theta 1)$, which may depend upon the refractive indices, n1 and n2, and upon a surface coating for the surface P1 This light beam is reflected by the surface P1 at an angle $2\theta 1$, intersects the SCC surface P2 at normal incidence, and passes through the parabola focus (x=0,y=k/2).

Figure 4:
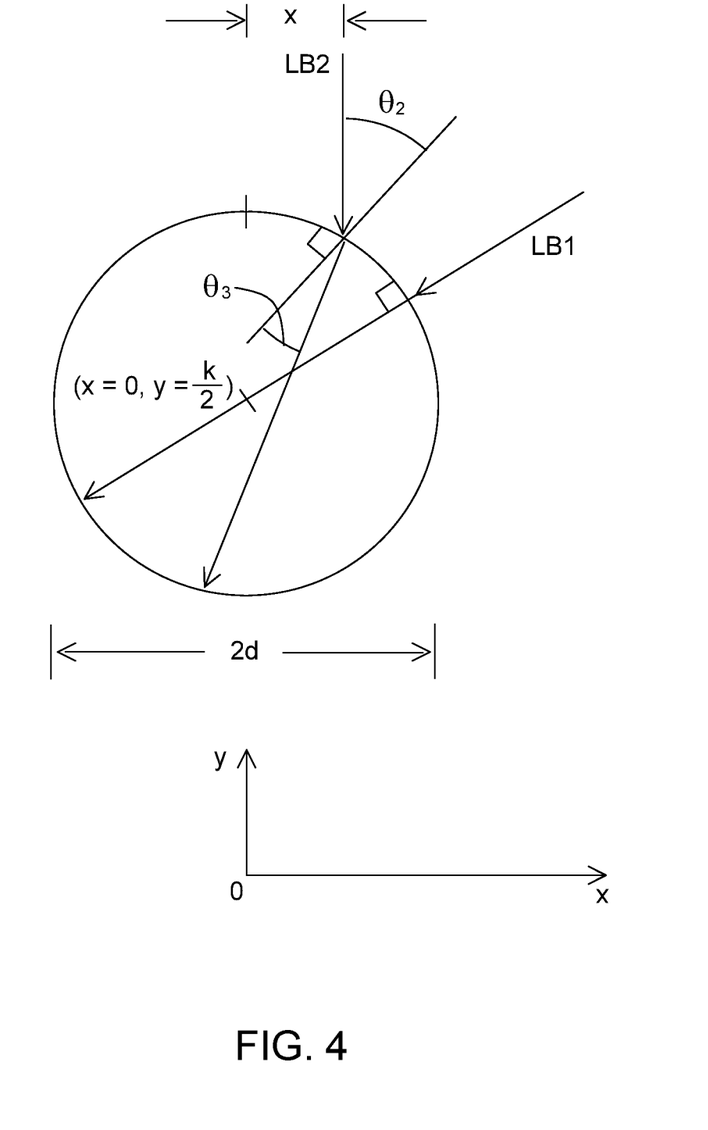

The surface P2 of the SCC defines a cylinder/or sphere of SCC material, having a diameter of length $2d$, an absorption coefficient of $\alpha(\lambda 0)$ per unit path length within the interior of the paraboloid for the wavelength $\lambda 0$, and an associated absorption $\exp(-2\alpha d)$ for a light beam that passes along a diameter of the circular surface P2. Preferably, $2\alpha d \gg 1$ The reflection coefficient r1 associated with reflection at normal incidence of the first light beam from the inner surface P1 is determined as $$r1(\theta 2=0) = \{(n2-n1)/(n2+n1)\}^2, \qquad (12)$$

where n1 and n2 are the (wavelength-dependent refractive indices of the materials, M1 and M2, respectively, indicated in FIG. 3. Optionally, it may be assumed that the material M1 is substantially a vacuum so that n1=1. The reflection coefficients $r1(\theta 1)$ and $r2(\theta 2)$ are determined using the Fresnel relations in Eqs. (5) and (6), The reflection coefficients r1 and r2 can be modified, for a given wavelength $\lambda 0$, by providing a reflective or anti-reflective coating on the corresponding reflecting surface, P1 or P2, A second light beam portion LB2 moves parallel to the parabola axis, is displaced from the parabola axis by a distance x (−d≤x≤d, with d<D), and is not intercepted by or reflected by the parabola inner surface P1. This second light beam LB2 encounters the circular body at an incidence angle $$3 = \sin^{-1}(|x|/d) \qquad (13)$$

which is generally non-perpendicular, as illustrated in FIG. 4, which illustrates LB1 and LB2 relative to the SCC. The corresponding refraction angle $\theta 3$ within the SCC (across surface P2) is determined from Snell's law $$n1 \sin\theta 2 = n2 \sin\theta 3, \qquad (14)$$

for the M1/M2 interface. The path length $2d'$ within the SCC for the refracted portion of the second component of the light beam LB2 is $$2d' = 2d \cos\theta 3, \qquad (15)$$

and the attenuated fraction of the refracted component of the second light beam LB2t is $$f(d')-1-\exp\{-2\alpha d'\} = 1-\exp\{-2\alpha d' \cos\theta\}. \qquad (16)$$

Assuming that the parabolic surface P1 has a lateral extent of 2D (−D≤x≤D), the first components of the light beam, with −D≤x<−d and/or d<x≤D, will be received by the circular surface P2 at normal incidence, for maximum transmission into the SCC material; and the second components of the light beam, with −d≤x≤d, will be received directly by the circular surface P2 at an incidence angle $\theta 2=\sin^{-1}(|x|/d)$ with reduced transmission into the SCC material).

For first light beam components, received at P2 at normal incidence, ($\theta 2=0°$) an uncoated surface will provide a transmission coefficient $$t1(\theta 2=0) = \{(2 n1\ n2)/(n2+n1)\}^2. \qquad (17)$$

The refraction angle for the first light beam components is $\theta 2=0$; and each refracted first light beam component moves radially across the SCC concentrator to an antipodal point on the surface, P2 with path distance $2d$. For a second light beam component received at non-normal incidence ($\theta 2=\sin^{-1}(|x|/d)>0$), the refracted second light beam component moves non-radially across the cylinder. However, because the relevant refractive indices n1 and n2 satisfy n1 (=1)<n2, the refracted angle $\theta 4$ will be much less than the incidence angle $\theta 3$, and the refracted light beam path will be closer to a radial path within the SCC. A reasonable approximation here is that a second light beam component, corresponding to −d≤x≤d, also moves across the SCC with total length $2d$. With this perspective adopted, the fraction of refracted light beam energy deposited within the SCC by any first or second light beam component is $$f(d) = 1-\exp\{-2\alpha d\}, \qquad (18)$$

A first light beam component (reflected from the parabola surface) has a total fraction of light beam energy deposited within the SCC of $$EA1(\theta 1;d,k) = r1(\theta 1)r2(\theta 2=0)\{1-\exp\{-2\alpha d\}\}$$
$$(d \leq x \leq D) \qquad (19\text{-}1)$$

$$\theta 1 = \sin^{-1}(|x|/k), \qquad (19\text{-}2)$$

A second light beam component (received directly by the cylinder P2) has a total fraction of light beam energy deposited within the SCC of $$EA2(\theta 3,d) = r3(\theta 3)\{1-\exp\{-2\alpha d\}\}(0 \leq x \leq d), \qquad (20\text{-}1)$$

$$\theta 3 = \tan^{-1}(x/d). \qquad (20\text{-}2)$$

Each of the fractions EA1 and EA2 should be doubled to take account of the reflections and refractions that occur for the region −D≤x≤0, but this will have no effect on the optimization procedure. The fraction EA=EA1+EA2 for the paraboloid configuration shown in FIGS. 3 and 4 is optimized with respect to a choice of the radius d, and/or the focus parameter k,:

$$(\partial/\partial d)\{\int_0^d F22(\theta 3;d)dx + \int_d^D F21(\theta 1;d)dx\} = 0, \qquad (21\text{-}1)$$

$$(\partial/\partial k)\{\int_0^d F22(\theta 3;d)dx + \int_d^D F21(\theta 1;d)dx\} = 0, \qquad (21\text{-}2)$$

where Eqs. (1) and (2) are to be used for $\sin\theta 1$ and $\cos\theta 1$, respectively. The energy absorbed will increase monotonically with increasing attenuation coefficient $\alpha$, but $\alpha$ is not a parameter that is controllable by the user.

Prism.

Figure 5:
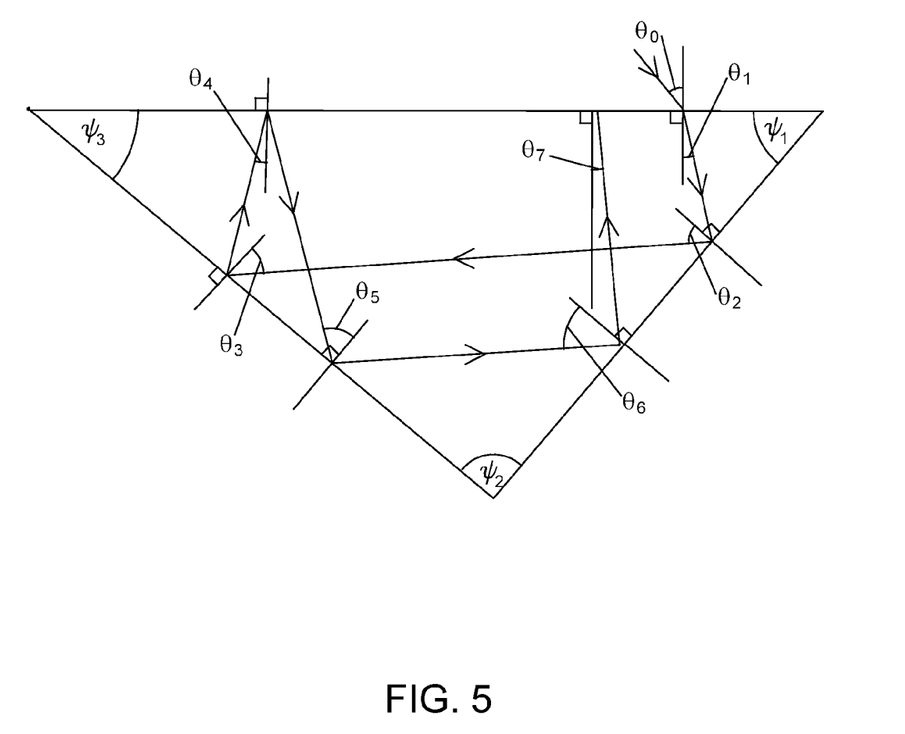

FIG. 5 illustrates a triangular prism Pr that receives an incident light beam LB0 at a location (x,y)=(x0,0) on a prism surface S1 with incidence angle $\theta 0$. A portion of the light beam $t(\theta 1)$ is transmitted and refracted into the prism material with refraction angle $\theta 1$, and the refracted light beam is internally reflected without end from the three prism surfaces, S1, S2 and S3, as indicated in FIG. 5. The triangular prism is defined, in part, by the three prism angles, $\psi 1$, $\psi 2$ and $\psi 3$ (assumed to be fixed), which satisfy $$\Psi 1+\psi 2+\psi 3=\pi. \qquad (22)$$

FIG. 5 also illustrates an ordered sequence of reflection angles, $\theta 1$, $\theta 1$, $\theta 3$, $\theta 4$, $\theta 5$, $\theta 6$, $\theta 7$, etc. of internal reflections from the prism surfaces. The incident light beam encounters the first prism surface S1 at initial incident angle $\theta 0$ and is transmitted into the prism and refracted at an initial refraction angle $\theta 1$. The once-refracted light beam LB1 approaches the second prism surface S2 at an incident angle $\theta 2$, where $$\psi 1+(\pi/2-\theta 1)+(\pi/2-\theta 2)=\pi, \qquad (23\text{-}1)$$

$$\theta 2=\psi 1-\theta 1, \qquad (23\text{-}2)$$

The once-refracted, once-internally reflected light beam LB2 approaches the third prism surface S3 at an incident angle $\theta 3$, where $$(\pi/2-\theta 2)+\psi 2+(\pi/2-\theta 3)=\pi. \qquad (24\text{-}1)$$

$$\theta 3=\psi 2\,\theta 2=\psi 2\,\psi 1+\theta 1, \qquad (24\text{-}2)$$

The twice-internally reflected light beam LB3 approaches the first prism surface S1 at an incident angle $\theta 4$, where $$(\pi/2-\theta 3)+\psi 3+(\pi/2+\theta 4)=\pi. \qquad (25\text{-}1)$$

$$\theta 4=-\psi 3-\theta 3=-\psi 3-\psi 2+\psi 1-\theta 1, \qquad (25\text{-}2)$$

The next three angles of reflection, illustrated in FIG. 5, are determined by the relations $$\theta 5=-\psi 3-\theta 4=-\psi 2-\psi 1+\psi 1+\theta 1, \qquad (26)$$

$$\theta 6=-\psi 3-\theta 5=-\psi 2-\psi 1+\theta 1, \qquad (27)$$

$$\theta 7=-\psi 3-\theta 6=\theta 1, \qquad (28)$$

From this point on, it appears that the sequence of reflection angles repeats for general prisms.

A shorter pattern of reflection angles may also develop. The incidence angle $(-)\theta 4$ in Eq. (25-2) is equal to the initial refracted angle $\theta 1$ if and only if $$\Psi 1-\psi 2+\psi 3=0, \qquad (29)$$

$$\theta 4=(-)\theta 1. \qquad (30)$$

Equations (22) and (2-25) require that $$\psi 2=\pi/2, \qquad (31)$$

$$\psi 1+\psi 3=\psi 2=\pi/2. \qquad (32)$$

in order that the light beam execute cycles within the prism with a sequence of repeating incidence angle triples, $\{\theta 1, \theta 2, \theta 3, \theta 1, \theta 2, \theta 3, \text{etc.}\}$ Note that the locations on the prism surfaces where the incident light beams are reflected will normally not repeat. However, the reflection angle triples $\{\theta 1, \theta 2, \theta 3\}$ do repeat and are therefore predictable and determinable from $\theta 1$, or from $\theta 2$ or from $\theta 3$. A surface coating can therefore be determined for each of the prism surfaces, based on the respective reflection angle $\theta 1$, $\theta 2$ or $\theta 3$ for that surface, that maximizes the reflection coefficient and minimizes transmission coefficient at an M1/M2 interface. The choice of prism angles $\Psi 1$, $\psi 2$ and $\psi 3$ in Eq. (32) may lead to some simplifications in the subsequent analysis. However, in order to keep the scope as general as possible, general prism angles, $\Psi 1$, $\psi 2$ and $\psi 3$ will be assumed here, including but not limited to the special constraint set forth in Eq. (32).

For a first half cycle of the light beam, involving the reflection angle $\theta 1$, $\theta 2$, and $\theta 3$, (S1→S2→S3), the fraction of energy EA of initial light beam energy deposited in the material M2 is a sum of energy increments deposited along the individual path segments and can be expressed as a fraction of the light beam energy originally incident on the first surface S1:

$$EA(1,2,3)=t1\{(1-e12)+e12r2(1-e23)\}+e12\,r2\,e23 \\ r3(1-e31), \qquad (33)$$

$$e12=\exp(-\beta(\lambda)\Delta s12), \qquad (34\text{-}1)$$

$$e23=\exp(-\beta(\lambda)\Delta s23), \qquad (34\text{-}2)$$

$$e31=\exp(-\beta(\lambda)\Delta s31), \qquad (34\text{-}3)$$

where $\Delta sij$ is the path length between the path intersections with the prism surface Si and the prism surface Sj for this particular light beam path. For each cycle, the path length increments $\Delta sij$ will vary. However, the sum of the cycle path length increments, $\Delta s12+\Delta s23+\Delta s31$, may be approximated by a path length value $L(avg)=(\Delta s12+\Delta s23+\Delta s31)(avg)$ that may not vary strongly from one cycle to the next cycle.

For the combined first half and second half of the general path cycle, involving the reflection angle $\theta 1$, $\theta 2$, $\theta 3$, $\theta 4$, $\theta 5$, $\theta 6$ and $\theta 7$, (S1→S2→S3→S2→S1), the fraction of energy deposited along the combined first and second halves of this cycle is $$t1\,EA(1,2,3,4,5,6)=t1\{(1-e12)+e12\,r2(1-e23)\}+e12 \\ r2\,e23\,r3(1-e34)+e12\,r2\,e23\,r3\,e34\,r4(1-e45)+ \\ e12\,r2\,e23\,r3\,e34\,r4\,e45\,r5(1-e56)++e12\,r2\,e23 \\ r3\,e34\,r4\,e45\,r5\,e56\,r6(1-e67)\} \qquad (35)$$

$$e34=\exp(-\beta(\lambda)\Delta s34), \qquad (36\text{-}1)$$

$$e45=\exp(-\beta(\lambda)\Delta s45), \qquad (36\text{-}2)$$

$$e56=\exp(-\beta(\lambda)\Delta s56), \qquad (36\text{-}3)$$

$$e67=\exp(-\beta(\lambda)\Delta s67), \qquad (36\text{-}4)$$

The fraction of the energy present at the beginning of a second path cycle (first half plus second half) is $$t1\,E0=t1\{e12\,r2\,e23\,r3\,e34\,r4\,e45\,r5\,e56\,6\,e67\,r7, \qquad (37)$$

and this factor is multiplied by the factor EA(1,2,3,4,5,6) to determine the fraction of energy deposited in the material M2 by the multiply-reflected light beam during its second full cycle. More generally, for the kth full cycle of the light beam ($k \geq 2$), the fraction of energy deposited is the factor t1E0, multiplied by $\{EA(1,2,3,4,5,6)\}^{k-1}$. Collecting the fraction of energy deposited in the material M2 for all cycles, this fraction can be expressed as $$\Delta E-t1\,E0/\{1-EA(1,2,3,4,5,6)\} \qquad (38)$$

For fixed prism angles, $\Psi 1$, $\psi 2$ and $\psi 3$ the quantity $\Delta E$ is maximized by choice of the initial refraction angle q1:

$$d\Delta E)(d\theta 1)=\{d(t1)/d\theta 1)=t1\,E0/\{1-EA(1,2,3,4,5,6)\}+t1 \\ (d/d\theta 1)\{E0/\{1-EA(1,2,3,4,5,6)\}\}=0, \qquad (39)$$

where Eq. (3) is used to convert $d/d\theta 0$ to $d/d\theta 1$ for the factor t1.

The quantities e12, e23, e34, e45, e56 and e67 would normally vary individually from one cycle to the next, although the reflection coefficients r,2 r3, r4, r5, r6 and r7 will not vary from one cycle to the next cycle, For purposes of the estimate of cumulative light beam energy deposited in the material M2 over all cycles, the quantities e12, e23, e34, e45, e56 and e67 are replaced by representative values e12(avg), e23(avg), e34(rep), e45(avg), e56(avg) and e67(avg), respectively.

Light Collector.

The solar cell concentrators discussed and illustrated in FIGS. 2-5 implicitly assume that the incident angle θ for the incident light beam is constant, or nearly so. This can be difficult to achieve where the light beam source moves substantially in the ambient medium. However, most useful light from a solar source is received within a cone having a cone half angle of about 35°.

Figure 6:
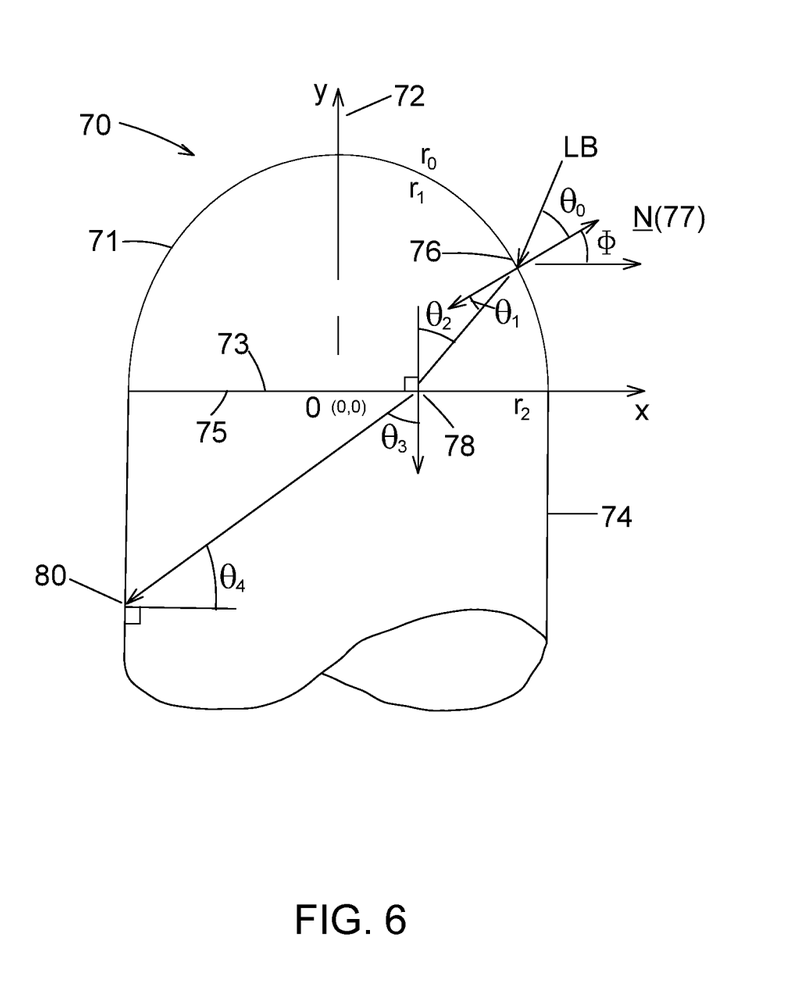
FIGS. 6 and 7 illustrate a light collector mechanism that accepts and aligns light beams from a variety of directions.
Figure 7:
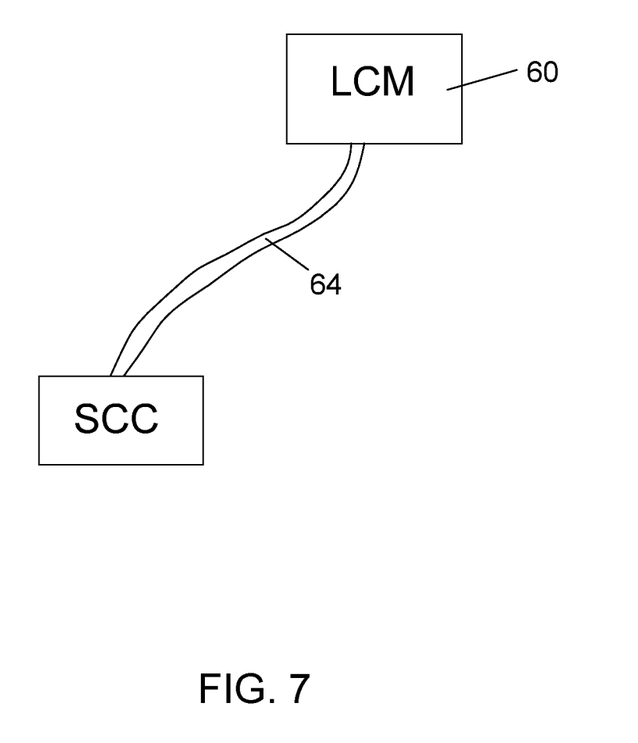

One method of partially controlling the incident angle is illustrated in one embodiment of a light collector mechanism (LCM) module 60 in FIGS. 6 and 7 The LCM module 60 comprises a relatively transparent optical module 61 that is shaped as half a circle or as half a sphere of diameter 2a and has a central axis 62. The optical module 61 has a planar surface 63 that is contiguous to a cylindrically shaped optical fiber 64 having a planar end 65. The optical module 61 and the optical fiber 64 have respective refractive indices n1(λ) and n2(λ), where n1(λ) at a representative wavelength λ0 is at least as large as, n2(λ0).

An incident light beam LB0 is received at a location 66 on the surface of the optical module 61, and the light beam incident path defines an incidence angle θ0 with respect to a vector N(67) normal to the surface of the optical module 60 at the location 66, which has location coordinates (x(66),y(66)). The normal vector N(67) defines an angle, Φ=Φ(max), relative to the planes 63 and 65 so that the location coordinates (x(66),y(66))=(a cos Φ, a sin Φ) relative to the origin O at which the central axis 62 intersects the planes 63 and 65.

A portion of the incident light beam LB0 is refracted into the interior of the optical module 61 at a refraction angle θ1 relative to the normal vector N(67). The once-refracted light beam LBR1 propagates within the optical module 61 and the associated light beam path intersects the planes 63 and 65 at a location 68 having location coordinates (x(68),y(68))=(a cos Φ−Δs cos(Φ+θ1), 0), where Δs sin(Φ+θ1)=a sin Φ.

The once-refracted light beam LBR1 approaches the planes 63 and 65 at an incident angle θ2, where θ1+θ2+Φ=π, and is refracted at the planes 63 and 65 to a refraction angle θ3 as a twice-refracted light beam LBR2, relative to a vector N(69) that is normal to these planes. The light beam LBR2 propagates within the optical fiber 64 and intersects a surface of the fiber at an incident angle θ4=π/2−θ3 at a location 70.

Total internal reflection (TIR) occurs at the location 70 if n2 sin θ4≥n0. Total internal reflection is desirable here in order to deliver, to the SCC, shown in FIG. 7, the energy contained in the twice-refracted light beam LBR2 received at the location 70. By using TIR and modest bending of the optical fiber 64, the resulting light beam can be delivered to an SCC (rectangular parallelepiped, paraboloid, prism or any other SCC with optimized incidence angle θ) with the appropriate incidence angle. From the preceding discussion, the following constraints are applicable to the light beam path(s) in FIG. 6, in order to achieve TIR at the surface location 80.

$$n0 \sin θ0 = n1 \sin θ1, \quad (40)$$

$$(x(76),y(76)) = (a \cos Φ, a \sin Φ), \quad (41)$$

$$(x(78),y(78)) = (a \cos Φ − Δs \cos(Φ+θ1), 0) = ((a \cos Φ − a \sin Φ \cot(Φ−θ1), 0) \quad (42)$$

$$Δs \sin(Φ−θ1) = a \sin Φ, \quad (43)$$

$$θ1+θ2+π/2+Φ=π, \quad (44)$$

$$n1 \sin θ2 = n2 \sin θ3, \quad (45)$$

$$θ4=π/2−θ3, \quad (46)$$

$$a \cos Φ − a \sin Φ \cot(Φ−θ1) ≥ −a, \quad (47)$$

$$n2 \sin θ4 ≥ n0, \quad (48)$$

The optical module 71 need not be a full half circle or a full hemisphere but should have a planar lower surface that is contiguous to a planar upper surface of the optical fiber 64. Providing an optical module 71 that is less than half a circle or less than half a hemisphere will effectively mask a portion of the light source (e.g., solar). This is acceptable if the mask, located at the horizon, has an angular value no more than about 10°-20°.

Where an optical module parameters satisfy Eqs. (40)-(48), a remainder of the received solar light beam will be received at or close to a selected (optimum) incident angle. Variation of the actual incident angle from the optimum incident angle will vary with the angular difference θ4 at 80.

Ideally, the refractive indices n1 and n2 are the same (θ2=θ3) and are relatively high, and the materials are reasonably transparent for the wavelength λ0 of interest. Impure flint glass has a refractive index in a range n=1.52-1.92. Titanium dioxide, diamond and strontium titanate have refractive indices in a range n=2.41-2.49. Sapphire has a refractive index in a range 1.76-1.78. Most other materials of interest have refractive indices no higher than about 1.6.

What is claimed is:

1. A method for receipt and optimal concentration of light beam energy in a solar energy conversion cell, the method comprising:

providing a light energy conversion cell (LECC), having a rectangular parallelepiped shape, comprising first and second, parallel, planar, light-receiving and reflecting surfaces, S1 and S2, facing each other and spaced apart a distance h, and further comprising a material M2 of thickness h, positioned between the surfaces S1 and S2 and having an LECC refractive index n2(λ) at a representative wavelength λ of a solar radiation light beam;

positioning the LECC to receive an incident solar radiation light beam, propagating in a first medium M1 having a refractive index n1(λ), at an initial incidence angle θ1 at the first surface S1;

allowing the first surface S1 to transmit and refract a portion of the received light beam, with a transmission coefficient, t1=t1(θ1), into the material M2 at a refraction angle θ2, and permitting the received light beam to propagate from the first surface S1 to the second surface S2 at an internal reflection angle equal to θ2, to be reflected at the surface S2 with a reflection coefficient, r2=r2(θ2), and to return toward the first surface S1 at the internal reflection angle θ2, where the internal reflection angle θ2 and the initial incidence angle θ1 satisfy a Snell's law relation between the angles θ1 and θ2 for at least one of the first surface S1 and the second surface S2;

allowing the portion of the received solar radiation within the LECC to be reflected alternatingly at least two times from the surface S1 and from the surface S2;

estimating a fractional attenuation coefficient, e=e(θ2,h), of the refracted light beam in propagating once between the surface S1 and the surface S2;

estimating a fraction t1(θ1) EA(θ1,θ2) of light beam energy absorbed by the M2 material; and selecting at least one of the angles $\theta 1$ and $\theta 2$ to provide an approximate maximum for the fraction $F(\theta 2,h;\lambda)$ of light beam energy absorbed by the LECC.

2. The method of claim 1, further comprising estimating said fraction $t1(\theta 1)EA(\theta 1,\theta 2)$ as $$t1(\theta 1)EA(\theta 1,\theta 2)=t1(\theta 1)e/\{1-e\ r2)(1-e(\theta 2,h;\lambda))\}$$

and estimating said fractional attenuation coefficient as $$e(\theta 2,h)=\exp\{-\alpha(\lambda)h\ \sec\theta 2\}$$

where $\alpha(\lambda)$ is an absorption coefficient associated with propagation of the light beam energy within said material M2, $t1(\theta 1)$ and $r2(\theta 2)$ are said light beam transmission coefficient and said light beam reflection coefficient, respectively, for said light beam energy received at said surface S1, traveling within said second material M2.

3. The method of claim 2, further comprising applying said Snell's law relation in a form $n1(\lambda)\sin\theta 1=n2(\lambda)\sin\theta 2$.

4. The method of claim 3, wherein at least one of said angles, $\theta 1$ and $\theta 2$, is chosen to provide said approximate maximum of said fraction $t1(\theta 1)\ EA(\theta 1,\theta 2)$ by a process comprising: selecting at least one of said angles, $\theta 1$ and $\theta 2$, to satisfy said Snell's law relation and to satisfy at least one of the relations $\partial(t1(\theta 1)EA(\theta 1,\theta 2)/\partial\theta 1=0$ or $\partial(t1(\theta 1)EA(\theta 1,\theta 2)/\partial\theta 2=0$., where $\theta 1$ and $\theta 2$ are related by said Snell's law relation.

5. The method of claim 1, further comprising choosing said material M1 to be either a vacuum or air with a selected mass density or pressure.

6. The method of claim 1, further comprising choosing said material M2 to comprise at least one inorganic material, drawn from a group consisting of bismuth oxides ($Bi_aO_b$), bismuth iodides ($Bi_cI_d$), lead iodide ($PbI_e$), cadmium sulfide (CdS), cadmium selenide (CdSe) and cadmium telluride (CdTe), where a, b, c, d and e are positive numerical values.

7. The method of claim 1, further comprising choosing said material M2 to comprise at least one polymer, drawn from a group consisting of poly[2-methoxy-5-(2'-ethylhexyloxy)-p-phenylenevinylene]] (MEH-PPV), olelamine, polythiophene and derivatives thereof, and poly[4,8-bis-substituted-benzo[1,2-b;4,5-b'dithophene-2,6-diyl-alt-4-substituted-thienol[3,4-b[thipphene-2,6-diyl]] (PBBTTT-CF).

8. The method of claim 1, further comprising receiving said incident light beam at a light energy collection mechanism that redirects said incident light beam, received at said incident angle $\theta 1$, to a selected and modified incident angle $\theta 1(sel)$ and delivers the redirected incident light beam to said first surface S1.

9. A method for receipt and optimal concentration of light beam energy in a solar energy conversion cell, the method comprising:
providing a light energy conversion cell (LECC), comprising (i) a paraboloid shaped surface P1, expressed in Cartesian coordinates (x,y) in a form $y=x^2/2k$, with $\_D\leq x\leq D$ for a selected positive distance D, and with a paraboloid focus located approximately at a position with coordinates $(x=0,y=k/2)$ and having a paraboloid longitudinal axis that passes through the focus, where an inner surface of the paraboloid reflects a light beam incident on the paraboloid inner surface, and (ii) a light beam concentrator, shaped as a circle or cylinder with a center located at the paraboloid focus, where the light concentrator has a diameter $2d$ and comprises a light-receiving material M2 that receives and refracts into an interior of the cylinder a light beam, having a representative wavelength $\lambda$, incident on a circle or cylinder surface of the material M2, and part or all of light beam energy is deposited in the material, where the light beam propagates a path distance $\Delta s$ in the material M2 with a fractional attenuation coefficient $e(\Delta s)$, where a material M1, positioned between the paraboloid surface and the circle or cylinder, permits propagation of the light beam;
positioning the LECC to receive a first portion of the light beam propagating in the material M1 at a selected incidence angle $\theta 1$ at the paraboloidal inner surface P1 and to reflect the first portion toward the parabola focus;
positioning the paraboloid surface and the circle or cylinder to initially receive a second portion of the light from a beam direction oriented approximately parallel to the parabola longitudinal axis and propagating within a distance d of the paraboloid longitudinal axsi, where $0<d\leq D$;
estimating a fraction $EA1(k,d,D)$ of the first portion of the light beam that is deposited in the material M2;
estimating a fraction $EA2(k,d)$ of the second portion of the light beam that is deposited in the material M2; and
selecting at least one of the quantities k, d and D to approximately maximize the fraction $EA1(k,d,D)+EA2(k,d)$ of said light beam energy delivered to and absorbed in said light beam concentrator.

10. The method of claim 9, further comprising applying said Snell's law relation in a form $n1(\lambda)\sin\theta 1=n2(\lambda)\sin\theta 2$.

11. The method of claim 9, further comprising estimating said fractional attenuation coefficient $e(\Delta s)$ as $$e(\Delta s)=\exp\{-\alpha(\lambda)\Delta s)\},$$

where $\alpha=\alpha(\lambda)$ is a light beam absorption coefficient, which may depend upon said wavelength $\lambda$, along a path of said length $\Delta s$ in said material M2.

12. The method of claim 11, further comprising estimating said fraction $F(k,d,D,\lambda)$ as $$EA1(k,d,D)+EA2(k,d)=\int_0^d t2(\theta 3=\sin^{-1}(x/d))\{1-\exp\{-\alpha(2d\cos(x/d)\}\}dx+\int_d^D r1(\theta 1=\sin^{-1}(x/k))r1(\theta 2=\pi/2)\{1-\exp(-2\alpha\,d)\}dx$$

where $\alpha(\lambda)$ is said light beam absorption coefficient associated with propagation of said light beam within said material M2, $r1=r1(\theta)$ is a light beam reflection coefficient for said light beam energy received at said parabola inner surface and, $t2=t2(\theta)$ is a light beam transmission coefficient for said light beam energy received at said circle or cylinder surface.

13. The method of claim 9, further comprising:
selecting at least one of said values k, D and d in order to approximately maximize said fraction $EA1(k,d,D)+EA2(k,d)$ of said light beam energy deposited in said light beam concentrator.

14. The method of claim 13, wherein at least one of said qualities k, d and D is chosen to provide said approximate maximum of said fraction $F=EA1(k,d,D)+EA2(k,d)$ by a process comprising: selecting at least one of said quantities k, d and D to satisfy at least one of the relations $\partial F/\partial k=0$, $\partial F/\partial d=0$ and $\partial F/\partial D=$.

15. The method of claim 9, further comprising choosing said material M1 to be either a vacuum or air with a selected mass density or pressure.

16. The method of claim 9, further comprising choosing said material M2 to comprise at least one inorganic material, drawn from a group consisting of bismuth oxides ($Bi_aO_b$), bismuth iodides ($Bi_cI_d$), lead iodide ($PbI_e$), cadmium sulfide (CdS), cadmium selenide (CdSe) and cadmium telluride (CdTe), where a, c, d and e are positive numerical values.

17. The method of claim 9, further comprising choosing said material M2 to comprise at least one polymer, drawn from a group consisting of poly[2-methoxy-5-(2'=ethylhexyloxy)-p-phenylenevinylene] (MEH-PPV), olelamine, polythiophene and derivatives, and poly[4,8-bis-substituted-benzo[1,2-b;4,5-b'dithophene-2,6-diyl-alt-4-substituted-thienol[3,4-b[thipphene-2,6-diyl] (PBBTTT-CF).

18. The method of claim 9, further comprising receiving said incident light beam at a light energy collection mechanism that redirects said incident light beam, received at said incident angle $\theta1$, to a selected and modified incident angle $\theta1(sel)$ and delivers the redirected incident light beam to said parabola surface P1.

19. A method for receipt and optimal concentration of light beam energy in a solar energy conversion cell, the method comprising:

providing a light energy conversion cell (LECC) as a triangular prism, comprising first, second and third light reflecting surfaces, where the first and second prism surfaces intersect at a first prism angle $\psi1$, the second and third prism surfaces intersect at a second prism angle $\psi2$, and the third and first prism surfaces intersect at a prism angle $\psi3$, with $\psi1+\psi2+\psi3=\pi$, and the prism comprises a prism material M2 that supports propagation of a light beam therein, and where the material M2 has a refractive index $n2(\lambda)$ for a light beam with a representative wavelength $\lambda$;

positioning the LECC to receive a solar radiation light beam, having the representative wavelength $\lambda$ and propagating in an ambient medium M1 that has a refractive index $n1(\lambda)$, at an initial incidence angle $\theta0$, at the first prism surface, and permitting a portion of the light beam to be transmitted into and refracted within the material M2 with a refraction angle $\theta1$, where the angles $\theta0$ and $\theta1$ are related by a Snell's law relation;

allowing the refracted light beam to propagate within the material M2 and to be alternatively reflected from the second surface, the third surface and the first surface at least two times within the material M2;

estimating a fraction $t1(\theta0)$ $EA(\theta0,\theta1,\psi1, \psi2;\psi3;\Delta s)$ of the light beam energy deposited in the material M2 for at least two cycles of the light beam, each cycle including at least one reflection from the second surface, the third surface and the first surface, where a cycle of the light beam has a representative path length $\Delta s$ for a propagating light beam that is consecutively reflected from the second surface, from the third surface and from the first surface, or from the third surface, the second surface and the first surface, where $t1(\theta0)$ is a transmission coefficient for the incident light beam at the first surface for an incidence angle $\theta0$;

selecting at least one of the angles $\theta0$ and $\theta1$ to provide an approximate maximum for the fraction $t1(\theta0)$ $EA(\theta0, \theta1,\psi1,\psi2;\psi3'\Delta s)$ of the light beam energy deposited in the material M2.

20. The method of claim 19, further comprising estimating said fraction $F(\theta1,\theta2;\lambda)$ as $$t1(\theta0)EA(\theta0,\theta1,\psi1,\psi2;\psi3;\Delta s)=t1(\theta0)e/1-e(\Delta s)r2(\theta1;\lambda)(1-e(\Delta s))\}$$

and estimating a fractional attenuation coefficient as $$e(\Delta s)=\exp\{-\alpha(\lambda)\Delta s\}$$

where $\alpha(\lambda)$ is an absorption coefficient associated with propagation of the light beam energy within said material M2, and $t1(\theta0)$ and $r2(\theta1;\lambda)$ are said light beam transmission coefficient and said light beam internal reflection coefficient, respectively, for said light beam energy received at said first surface.

21. The method of claim 19, further comprising applying said Snell's law relation in a form $n1(\lambda)\sin\theta1=n2(\lambda)\sin\theta2$ for said refraction of said incident solar radiation light beam at said first prism surface.

22. The method of claim 19, further comprising receiving said incident light beam at a light energy collection mechanism that redirects said incident light beam, received at said incident angle $\theta1$, to a selected and modified incident angle $\theta1(sel)$ and delivers the redirected incident light beam to said first surface.

* * * * *